(12) United States Patent
Chu et al.

(10) Patent No.: US 6,989,337 B2
(45) Date of Patent: Jan. 24, 2006

(54) SILICON OXIDE GAP-FILLING PROCESS

(75) Inventors: Hsiu-Chuan Chu, Hsinchu (TW); Chih-An Huang, Taipei County (TW); Teng-Chun Tsai, Hsinchu (TW); Neng-Kuo Chen, Hsinchu (TW)

(73) Assignee: United Microelectric Corp., Hsinchu (TW)

(*) Notice: Subject to any disclaimer, the term of this patent is extended or adjusted under 35 U.S.C. 154(b) by 0 days.

(21) Appl. No.: 10/605,478

(22) Filed: Oct. 2, 2003

(65) Prior Publication Data
US 2005/0074946 A1   Apr. 7, 2005

(51) Int. Cl.
*H01L 21/31* (2006.01)
(52) U.S. Cl. .................. 438/788; 438/424; 438/787
(58) Field of Classification Search ............. 438/424, 438/787, 788, 789
See application file for complete search history.

(56) References Cited

U.S. PATENT DOCUMENTS

| | | | |
|---|---|---|---|
| 5,872,058 A | 2/1999 | Van Cleemput | 438/692 |
| 6,030,881 A | 2/2000 | Papasouliotis | 438/424 |
| 6,335,261 B1 | 1/2002 | Natzle | 438/435 |
| 6,589,854 B2 * | 7/2003 | Liu et al. | 438/435 |
| 6,596,654 B1 * | 7/2003 | Bayman et al. | 438/788 |
| 6,740,601 B2 * | 5/2004 | Tan et al. | 438/771 |
| 2003/0087506 A1 * | 5/2003 | Kirchhoff | 438/424 |
| 2003/0207580 A1 * | 11/2003 | Li et al. | 438/700 |
| 2004/0079632 A1 * | 4/2004 | Ahmad et al. | 204/192.3 |
| 2004/0079728 A1 * | 4/2004 | Mungekar et al. | 216/67 |
| 2004/0115898 A1 * | 6/2004 | Moghadam et al. | 438/435 |
| 2004/0126952 A1 * | 7/2004 | Gondhalekar et al. | 438/200 |
| 2004/0146661 A1 * | 7/2004 | Kapoor et al. | 427/569 |

* cited by examiner

Primary Examiner—Christian D. Wilson
(74) Attorney, Agent, or Firm—J.C. Patents

(57) ABSTRACT

A silicon oxide gap-filling process is described, wherein a CVD process having an etching effect is performed to fill up a trench with silicon oxide. The reaction gases used in the CVD process include deposition gases and $He/H_2$ mixed gas as a sputtering-etching gas, wherein the percentage of the $He/H_2$ mixed gas in the total reaction gases is raised with the increase of the aspect ratio of the trench.

8 Claims, 2 Drawing Sheets

SILICON OXIDE GAP-FILLING PROCESS

BACKGROUND OF INVENTION

1. Field of the Invention

The present invention relates to a semiconductor process. More particularly, the present invention relates to a silicon oxide gap-filling process, which is suitably used to fill up a trench having a high aspect ratio (AR).

2. Description of the Related Art

As the semiconductor industry advances into the deep sub-micron generation, the active area isolation structure in a device under 0.18 μm is usually formed utilizing a shallow trench isolation (STI) process. In an STI process, a shallow trench is formed first on a substrate, and then a chemical vapor deposition (CVD) process is performed to fill up the shallow trench with silicon oxide. Since a sub-micron device generally has shallow trenches of a high aspect ratio (AR), high-density-plasma chemical vapor deposition (HDP-CVD) methods are usually used for silicon oxide deposition. In an HDP-CVD process, deposition gases and sputtering-etching gases, such as inert gases like argon and helium, are simultaneously used to perform deposition and sputtering-etching at the same time, so that voids will not be formed in the silicon oxide layer filled into the trench.

However, as shown in FIG. 1, when the width of a trench 110 on a substrate 100 is further scaled down, the silicon sputtered from one side of the silicon oxide layer 120 will redeposit on the opposite side. Thus, overhangs 130 are formed at the top corners of the trench 110 to cause a void 140 to be formed in the silicon oxide layer 120. Therefore, the etching/deposition ratio (ED ratio) of the HDP-CVD process is usually adjusted to above 0.2 to well separate the two facets of the silicon oxide layer over the trench, so as to prevent joint of the two overhangs and formation of a void, as described in U.S. Pat. No. 5,872,058. However, the ED ratio cannot be overly raised, or a corner clipping problem is adversely caused. As shown in FIG. 2, when a silicon oxide layer 220 is deposited with an overly high ED ratio, the substrate 200 at the top corners of the trench 210 will be clipped, and the active area is thus damaged.

Another method for solving the overhang problem is to change the species and percentage of the sputtering-etching gas. When the aspect ratio of the trench is lower than 3 in a process above 0.18 μm, the sputtering-etching gas is usually argon, and has a percentage of 30~60%. While the process linewidth is scaled down to 0.13 μm and the aspect ratio of the trench is raised to above 3 correspondingly, lighter helium is used in replacement of argon, and the percentage of helium is reduced to under 13% to inhibit the redeposition effect.

However, when the process linewidth is continuously scaled down to result in an aspect ratio equal to or higher than 4, even the optimum sputtering-etching/deposition conditions usually cannot overcome the redeposition and void problem. Therefore, some deposition/etching/deposition methods are provided to solve the problem, as described in U.S. Pat. Nos. 6,030,881 and 6,335,261. 6,030,881 discloses a method that periodically adjusts the ED ratio to alternately perform deposition steps and sputtering-etching steps. U.S. Pat. No. 6,335,261 discloses a method that alternately performs deposition steps and etching steps, wherein each etching step includes a reaction stage and a desorption stage. Though the deposition/etching/deposition methods are capable of solving the void problem, they all suffer from tedious steps.

SUMMARY OF INVENTION

Accordingly, this invention provides a silicon oxide gap-filling process to solve the redeposition and void problem.

Another object of this invention is to provide a silicon oxide gap-filling process that can be completed within a single step, so as to avoid the tedious steps in the deposition/etching/deposition methods in the prior art.

The silicon oxide gap-filling process of this invention utilizes a CVD process having an etching effect (e.g., an HDP-CVD process) to fill up a trench with silicon oxide, wherein $He/H_2$ mixed gas is used as a sputtering-etching gas. The percentage of the $He/H_2$ mixed gas in the total reaction gases is raised with the increase of the aspect ratio of the trench. This invention is particularly suitable for the cases where the aspect ratio of trench is higher than 3. While the aspect ratio of the trench reaches 4 or higher, the percentage of the $He/H_2$ mixed gas is preferably 70% or more. In addition, the deposition gases used in the CVD process include $SiH_4$ and $O_2$, for example.

Since the addition of hydrogen in the CVD process of this invention can inhibit the redeposition effect and formation of overhangs, this invention is particularly suitable for a gap-filling process of high aspect ratio. Meanwhile, the ED ratio of the CVD process of this invention can be adjusted down to 0.1–0.03 from a value of 0.2 or higher in the prior art, so as to prevent correlating problems like corner clipping. Moreover, the gap-filling process of this invention can be completed within a single step without changing process parameters, so the method of this invention is much simpler than those in the prior art.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
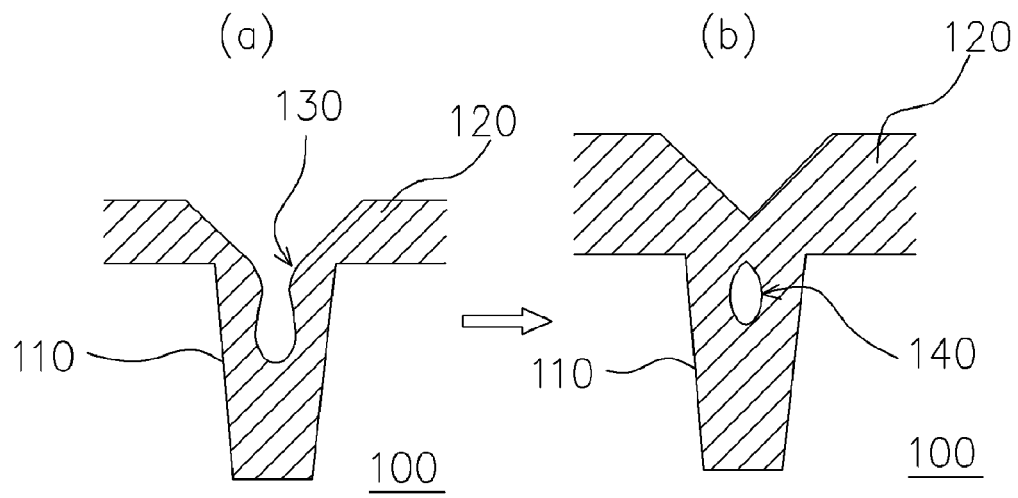
FIG. 1 schematically illustrates the overhangs and the void formed in a silicon oxide gap-filling process in the prior art.
Figure 2:
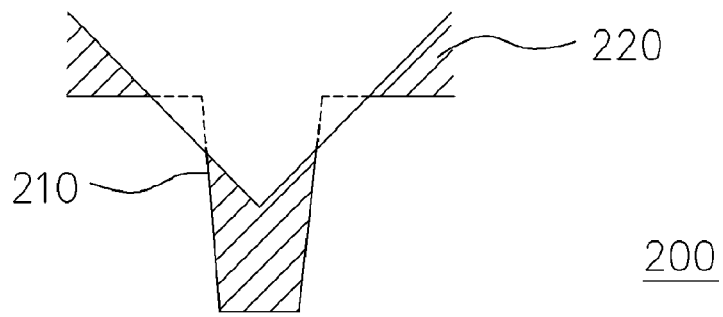
FIG. 2 schematically illustrates the corner clipping phenomenon occurring in a silicon oxide gap-filling process in the prior art.
Figure 3:
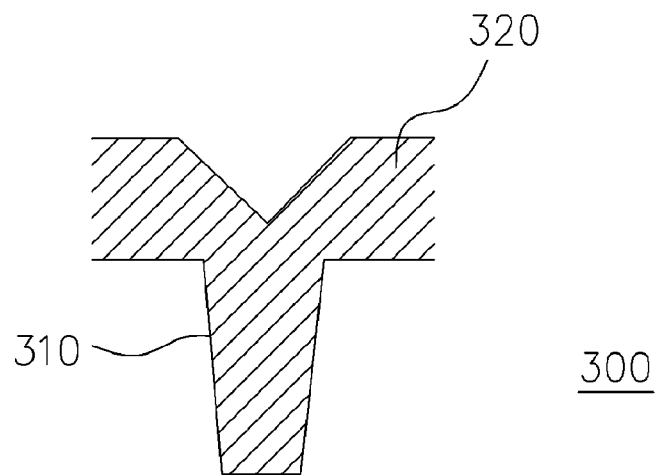
FIG. 3 illustrates a silicon oxide gap-filling process according to a preferred embodiment of this invention in a cross-sectional view.

Referring to FIG. 3, a substrate 300 having a trench 310 formed thereon is provided, wherein the substrate 300 is constituted of a silicon substrate and a mask layer thereon, for example, and the trench 310 may be a trench of a STI structure. For a STI structure formed in a semiconductor process under 0.13 μm, the aspect ratio of the trench 310 is usually higher than 3. For a STI structure formed in a 90 nm semiconductor process, the aspect ratio of the trench 310 is usually 4 or higher, and the width of the trench 310 is about 130–140 nm.

Then, an HDP-CVD process is performed to formed a silicon oxide layer 320 on the substrate 300 filling up the trench 310. The reaction gases used in the HDP-CVD process include deposition gases, such as $SiH_4$ and $O_2$, and $He/H_2$ mixed gas as a sputtering-etching gas, wherein the flow rate ratio of He to $H_2$ ($He/H_2$ ratio) is preferably 0.3–4, and the ED ratio is preferably adjusted to 0.1–0.03. Moreover, when the aspect ratio of the trench 310 reaches to 4 or higher, the percentage of the $He/H_2$ mixed gas is preferably 70% or more to effectively avoid formation of a void.

The ranges of the basic parameters of the HDP-CVD process are listed in Table 1, while the $He/H_2$ ratio, the ED ratio and the percentage of the $He/H_2$ mixed gas mentioned above can be adjusted by varying the basic process parameters.

TABLE 1

| | |
|---|---|
| Flow rate of $SiH_4$ | 20~100 sccm |
| Flow rate of $O_2$ | 40~200 sccm |
| Flow rate of $H_2$ | 100~2000 sccm |
| Flow rate of He | 200~2000 sccm |
| Pressure | 5~20 mTorr |
| Temperature | 400~650° C. |
| Low-frequency (LF) RF power | 3000~15000 W |
| High-frequency (HF) RF power | 500~5000 W |

Figure 4:
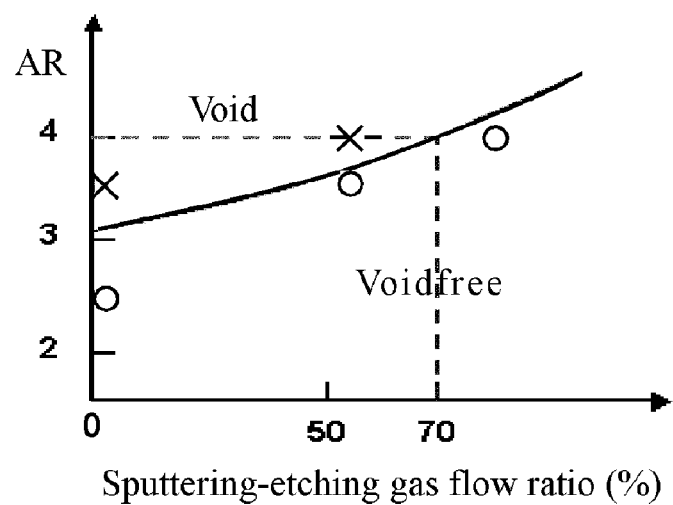
FIG. 4 shows the correlation between the percentage of $He/H_2$ mixed gas required in the HDP-CVD process and the aspect ratio of the trench in the preferred embodiment of this invention.
Figure 5:
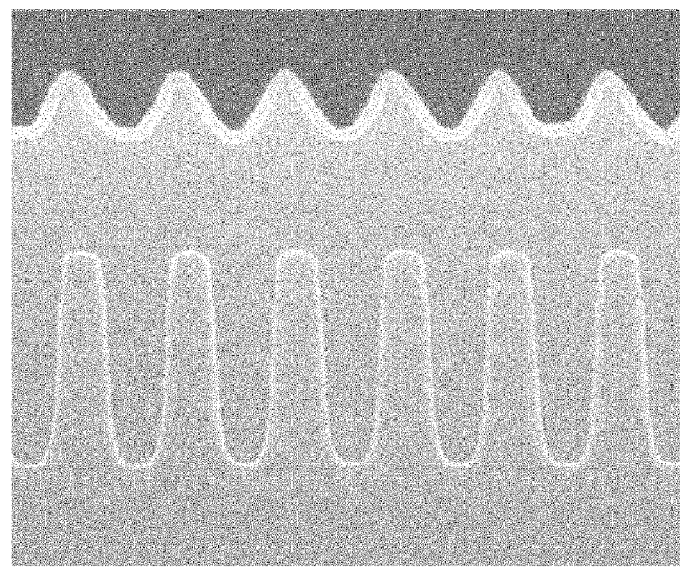
FIG. 5 shows the SEM photograph of the structure formed by filling silicon oxide into trenches of AR=4 with a percentage of sputtering-etching gas higher than 70% in the HDP-CVD process.

Referring to FIG. 4, FIG. 4 shows the correlation between the percentage of the $He/H_2$ mixed gas required in the HDP-CVD process and the aspect ratio of the trench in the preferred embodiment of this invention. FIG. 5 shows the SEM photograph of the structure formed by filling silicon oxide into trenches of AR=4 with a percentage of sputtering-etching gas higher than 70% in the HDP-CVD process. The trenches are formed in a 90 nm process, and the ED ratio of the HDP-CVD process is adjusted to 0.07.

As shown in FIG. 4, when $He/H_2$ mixed gas is not added, the trenches having an AR of 2.5 can be filled up (indicated by "O"), but those having an AR of 3.5 cannot be completely filled (indicated by "X"). When the percentage of the $He//H_2$ mixed gas is raised to 52%, the trenches having an AR of 3.5 can be completely filled, but those having an AR of 4.0 cannot be filled up. When the percentage of the $He/H_2$ gas is raised to 70% or above, however, the trenches having an AR of 4 can be completely filled. Accordingly, the percentage of the $He/H_2$ in the total reaction gases is raised with the increase of the aspect ratio of the trench. When the process conditions correspond to a point within the region under the curve in FIG. 4, voids can be prevented from being formed. On the contrary, when the process conditions correspond to a point within the region above the curve in FIG. 4, voids will be formed in the trenches.

Since the addition of hydrogen in the HDP-CVD process of the preferred embodiment of this invention can inhibit the redeposition effect and formation of overhangs, this invention is particularly suitable for a gap-filling process of high aspect ratio. Meanwhile, the ED ratio of the HDP-CVD process in the preferred embodiment of this invention can be adjusted down to 0.1–0.03 from 0.2 or more in the prior art, so as to prevent correlating problems like corner clipping. Moreover, the gap-filling process of this invention can be completed within a single step without changing process parameters, so the method of this invention is much simpler than those in the prior art. Furthermore, because hydrogen can inhibit formation of overhangs, the HDP-CVD gap-filling process of a semiconductor process of a smaller linewidth (e.g., 90 nm) can be performed in an HDP-CVD machine originally provided for a semiconductor process of a larger linewidth (e.g., 0.13 μm). Consequently, the cost for upgrading the manufacturing equipment can be saved.

It is noted that though the gap-filling process of this invention can be completed within a single step, the scope of this invention is not restricted to this. In accordance with the spirit of this invention, the gap-filling process may also be completed with multiple steps for optimizing the gap-filling effect. The multiple steps may be performed by repeatedly adjusting process parameters in situ, but may also be conducted in a non-in-situ manner.

It is also noted that though this invention is particularly useful for the cases where the aspect ratio of the trench is higher than 3, the scope of the application of this invention is not restricted to them. This invention can be further used in the cases where the aspect ratio are lower than 3, particularly those required to inhibit redeposition and formation of overhangs. Moreover, though a STI process is taken as an example in the preferred embodiment of this invention, the scope of the application of this invention is also not restricted to this, and can further include various gap-filling process of high aspect ratio conducted in multiple generations of semiconductor process.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A silicon oxide gap-filling process, comprising:
    providing a substrate having a trench thereon, wherein an aspect ratio of the trench is 4.0 at least; and
    performing a CVD process having an etching effect to fill up the trench with silicon oxide, wherein reaction gases used in the CVD process comprise deposition gases and $He/H_2$ mixed gas as a sputtering-etching gas, wherein an ED ratio of the CVD process is 0.03–0.1 and a percentage of the $He/H_2$ mixed gas in the total reaction gases is 70% at least.

2. The silicon oxide gap-filling process of claim 1, wherein the CVD process comprises an HDP-CVD process.

3. The silicon oxide gap-filling process of claim 1, wherein a ratio of He to $H_2$ ($He/H_2$ ratio) in the $He/H_2$ mixed gas is 0.3–4.0.

4. The silicon oxide gap-filling process of claim 1, wherein the deposition gases comprise $SiH_4$ and $O_2$.

5. The silicon oxide gap-filling process of claim 4, wherein in the CVD process, a flow rate of $SiH_4$ is 20–100 sccm, a flow rate of $O_2$ is 40–200 sccm, a flow rate of $H_2$ is 100–2000 sccm, a flow rate of He is 200–2000 sccm, a pressure is 5–20 mTorr, a temperature is 400–650° C., a low-frequency RF power is 3000–15000 W, and a high-frequency RF power is 500–5000 W.

6. The silicon oxide gap-filling process of claim 1, which is applied to an STI process in a 90 nm semiconductor process.

7. A silicon oxide gap-filling process, comprising:
    providing a substrate having a trench thereon, wherein an aspect ratio of the trench is at least 4.0;

performing an HDP-CVD process to fill up the trench with silicon oxide, wherein reaction gases used in the HDP-CVD process comprise $SiH_4$, $O_2$, He and $H_2$, wherein a flow rate of $SiH_4$ is 20–100 sccm, a flow rate of $O_2$ is 40–200 sccm, a flow rate of $H_2$ is 100–2000 sccm, a flow rate of He is 200–2000 sccm, a pressure is 5–20 mTorr, a temperature is 400–650° C., a low-frequency RE power is 3000–15000 W, and a high-frequency RF power is 500–5000 W;

an ED ratio of the HDP-CVD process is 0.1–0.03; and a percentage of the He/$H_2$ mixed gas in the total reaction gases is at least 70%.

8. The silicon oxide gap-filling process of claim 7, which is applied to an STI process in a 90 nm semiconductor process.

* * * * *